United States Patent
Chen et al.

(10) Patent No.: US 7,860,913 B2
(45) Date of Patent: Dec. 28, 2010

(54) SOUND SIGNAL PROCESSING SYSTEM AND RELATED APPARATUS AND METHOD

(75) Inventors: Hung-Kun Chen, Taipei County (TW); Sterling Smith, Hsin-Chu Hsien (TW)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 982 days.

(21) Appl. No.: 11/671,430

(22) Filed: Feb. 5, 2007

(65) Prior Publication Data

US 2008/0123772 A1    May 29, 2008

(30) Foreign Application Priority Data

Sep. 5, 2006    (TW) .............................. 95132670 A

(51) Int. Cl.
*G06F 17/10*    (2006.01)
(52) U.S. Cl. ..................................... 708/313
(58) Field of Classification Search ........................ None
See application file for complete search history.

(56) References Cited

U.S. PATENT DOCUMENTS

| | | | |
|---|---|---|---|
| 5,751,615 A * | 5/1998 | Brown | 708/313 |
| 6,173,302 B1 | 1/2001 | Piirainen | |
| 6,279,019 B1 * | 8/2001 | Oh et al. | 708/300 |
| 6,470,365 B1 * | 10/2002 | Rahman et al. | 708/313 |
| 7,047,264 B2 * | 5/2006 | Kishi | 708/313 |
| 2004/0107078 A1 | 6/2004 | Chiu | |
| 2004/0205827 A1 | 10/2004 | Krone | |
| 2005/0201494 A1 | 9/2005 | Yoon | |
| 2006/0059218 A1 * | 3/2006 | Hammond et al. | 708/301 |

FOREIGN PATENT DOCUMENTS

| | | |
|---|---|---|
| CN | 1761251 A | 4/2006 |
| EP | 1 044 506 | 10/2000 |
| WO | 99/34519 A1 | 7/1999 |

\* cited by examiner

*Primary Examiner*—David H Malzahn
(74) *Attorney, Agent, or Firm*—Winston Hsu; Scott Margo

(57) ABSTRACT

The invention discloses a finite impulse response (FIR) filter for processing a digital input signal to generate a digital output signal. The FIR filter has a tap amount N and a decimation ratio D. The FIR filter includes a first memory, a multiplier, and an accumulation module. For each input sample of the digital input signal, the first memory provides N/D corresponding tap coefficients from a plurality of tap coefficients in turn. The multiplier multiplies the input sample with the N/D corresponding tap coefficients in turn to generate N/D product values. The accumulation module adds the N/D product values to N/D previous accumulation values to generate N/D renewed accumulation values respectively. If one of the accumulation values has already accumulated N product values, the accumulation module outputs the accumulation value as an output sample of the digital output signal.

19 Claims, 4 Drawing Sheets

| Sampling period of digital input signal | T1_0 | T1_1 | T1_2 | T1_3 | T1_4 | T1_5 | T1_6 | T1_7 | T1_8 | T1_9 | T1_10 | T1_11 | T1_12 | T1_13 | T1_14 |
|---|---|---|---|---|---|---|---|---|---|---|---|---|---|---|---|
| Clock periods of filter | T2_0~T2_2 | T2_3~T2_5 | T2_6~T2_8 | T2_9~T2_11 | T2_12~T2_14 | T2_15~T2_17 | T2_18~T2_20 | T2_21~T2_23 | T2_24~T2_26 | T2_27~T2_29 | T2_30~T2_32 | T2_33~T2_35 | T2_36~T2_38 | T2_39~T2_41 | T2_42~T2_44 |
| Input sample | x0 | x1 | x2 | x3 | x4 | x5 | x6 | x7 | x8 | x9 | x10 | x11 | x12 | x13 | x14 |
| Provided tap coefficient | h0 | h5 | h4 | h3 | h2 | h1 | h0 | h5 | h4 | h3 | h2 | h1 | h0 | h5 | h4 |
| Provided tap coefficient | h2 | h1 | h0 | h5 | h4 | h3 | h2 | h1 | h0 | h5 | h4 | h3 | h2 | h1 | h0 |
| Provided tap coefficient | h4 | h3 | h2 | h1 | h0 | h5 | h4 | h3 | h2 | h1 | h0 | h5 | h4 | h3 | h2 |
| Output sample | y0 | | y1 | | y2 | | y3 | | y4 | | y5 | | y6 | | y7 |

Fig. 4

SOUND SIGNAL PROCESSING SYSTEM AND RELATED APPARATUS AND METHOD

BACKGROUND OF THE INVENTION

1. Field of the Invention

The present invention relates to TV audio signals, and more particularly, to a sound signal processing system that adaptively processes TV audio signals of different standards, and a related apparatus and method.

2. Description of the Prior Art

The National Television Standards Committee (NTSC) standard and the Phase Alternating Line (PAL) standard are among the most popular video standards around the world. Currently, countries may adopt different video standards and different audio standards for their TV systems. For example, TV systems in China adopt the PAL video standard and the FM-Mono or NICAM audio standard, where the frequencies of the sound carriers are 6.5 MHz and 5.85 MHz respectively. TV systems in Germany adopt the PAL video standard and the FM-Stereo (A2) audio standard, where the frequencies of the sound carriers are 5.5 MHz and 5.74 MHz respectively.

Since different video standards and audio standards are adopted by TV systems of different countries, manufacturers are trying their best to produce TVs that fit as many video/audio standards as possible. Therefore, with limited resources, system designers are urged to design TVs that are compatible with most TV systems around the world.

SUMMARY OF THE INVENTION

The present invention discloses a Finite Impulse Response (FIR) filter for processing a digital input signal to generate a digital output signal. The FIR filter has a tap amount N and a decimation ratio D. The FIR filter comprises: a first memory for storing a plurality of tap coefficients, wherein for an input sample of the digital input signal, the first memory provides N/D corresponding tap coefficients from the plurality of tap coefficients in turn; a multiplier, coupled to the first memory, for multiplying the input sample with the N/D corresponding tap coefficients provided by the first memory in turn to generate N/D product values; and an accumulation module, coupled to the multiplier, for adding the N/D product values to N/D previous accumulation values in turn to generate N/D renewed accumulation values, wherein for a renewed accumulation value of the N/D renewed accumulation values, if the renewed accumulation value has already accumulated N product values, the accumulation module outputs the renewed accumulation value as an output sample of the digital output signal.

The present invention discloses a down-conversion device for down-converting a digital input signal to generate a digital output signal. The down-conversion device comprises: a mixer, for generating a mixed signal according to the digital input signal; a Cascade Integrator Comb (CIC) filter, coupled to the mixer, for dividing the mixed signal by a first decimation ratio to generate a first frequency-divided signal; and a FIR filter, coupled to the CIC filter, for dividing the first frequency-divided signal by a second decimation ratio D to generate the digital output signal.

The present invention discloses a sound signal processing system for processing a sound IF signal. The sound signal processing system comprises: a gain amplifier, for amplifying the sound IF signal according to a gain so as to generate an amplified signal; a Low Pass Filter (LPF), coupled to the gain amplifier, for low-pass-filtering the amplified signal to generate a filtered signal; an Analog-to-Digital Converter (ADC), coupled to the LPF, for converting the filtered signal into a digital input signal; a down-conversion device, coupled to the ADC; and a Digital Signal Processor (DSP), coupled to the down-conversion device, for processing the digital output signal. The down-conversion device comprises: a mixer, coupled to the ADC, for generating a mixed signal according to the digital input signal; a CIC filter, coupled to the mixer, for dividing the mixed signal by a first decimation ratio to generate a first frequency-divided signal; and an FIR filter, coupled to the CIC filter, for dividing the first frequency-divided signal by a second decimation ratio D to generate the digital output signal.

The invention also discloses a method of performing an FIR-filtering operation on a digital input signal to generate a digital output signal. The FIR-filtering operation has a tap amount N and a decimation ratio D. The method comprises: for an input sample of the digital input signal, providing N/D corresponding tap coefficients from a plurality of tap coefficients in turn; multiplying the input sample with the N/D corresponding tap coefficients in turn to generate N/D product values; adding the N/D product values to N/D previous accumulation values in turn to generate N/D renewed accumulation values; and if a renewed accumulation value of the N/D renewed accumulation values has already accumulated N product values, outputting the renewed accumulation value as an output sample of the digital output signal.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 shows a diagram illustrating the operations of the In-phase FIR filter of FIG. 3.

DETAILED DESCRIPTION

Figure 1:
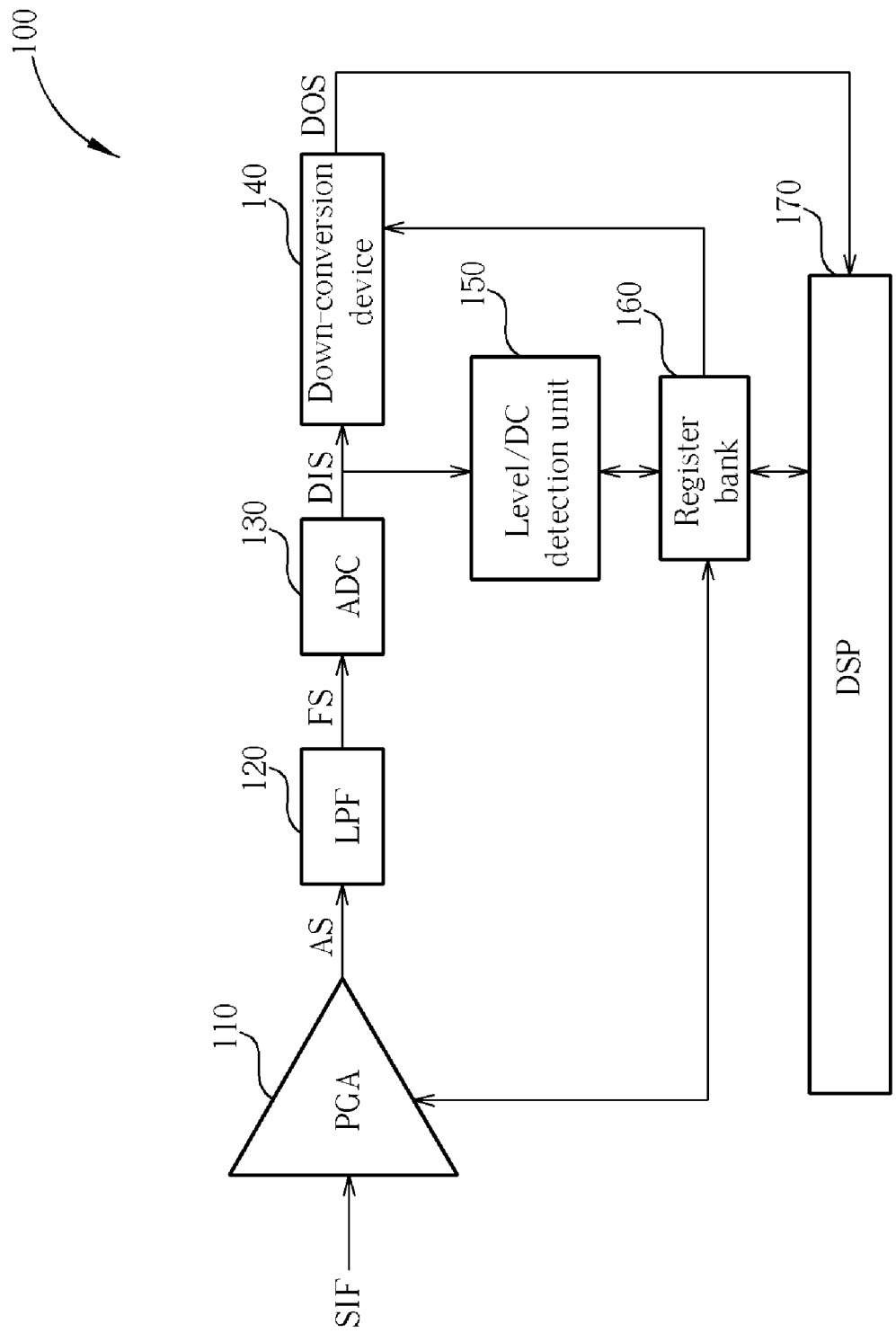
FIG. 1 shows a sound signal processing system according to an embodiment of the present invention.

FIG. 1 shows a sound signal processing system 100 according to an embodiment of the present invention. The sound signal processing system 100 of this embodiment comprises a programmable gain amplifier (PGA) 110, a low pass filter (LPF) 120, an analog-to-digital converter (ADC) 130, a down-conversion device 140, a level/DC detection unit 150, a register bank 160, and a digital signal processor (DSP) 170. The DSP 170 serves as a controlling unit that controls the sound signal processing system 100 to process sound IF signals of different audio standards. The register bank 160 serves as an interface that allows the DSP 170 to interact with the PGA 110, the down-conversion device 140, and the level/DC detection unit 150. For example, through the register bank 160, the DSP 170 controls a decimation ratio of a frequency down-conversion performed by the down-conversion device 140. Furthermore, through the register bank 160, the DSP 170 obtains the detection results of the level/DC detection unit 150, and accordingly controls gain and DC compensation of the PGA 110 through the register bank 160.

In this embodiment, the PGA 110 amplifies a TV sound IF signal SIF to generate an amplified signal AS according to a gain which is determined by the DSP 170. The LPF 120 filters the amplified signal AS to generate a filtered signal FS. The ADC 130 converts the filtered signal FS into a digital input signal DIS. The down-conversion device 140 mixes and down-converts the digital input signal DIS to generate a digital output signal DOS. The digital output signal DOS may comprise an In-phase part and a Quadrature-phase part. The DSP 170 processes the digital output signal DOS so that a TV can then play the TV sound accordingly.

Figure 2:
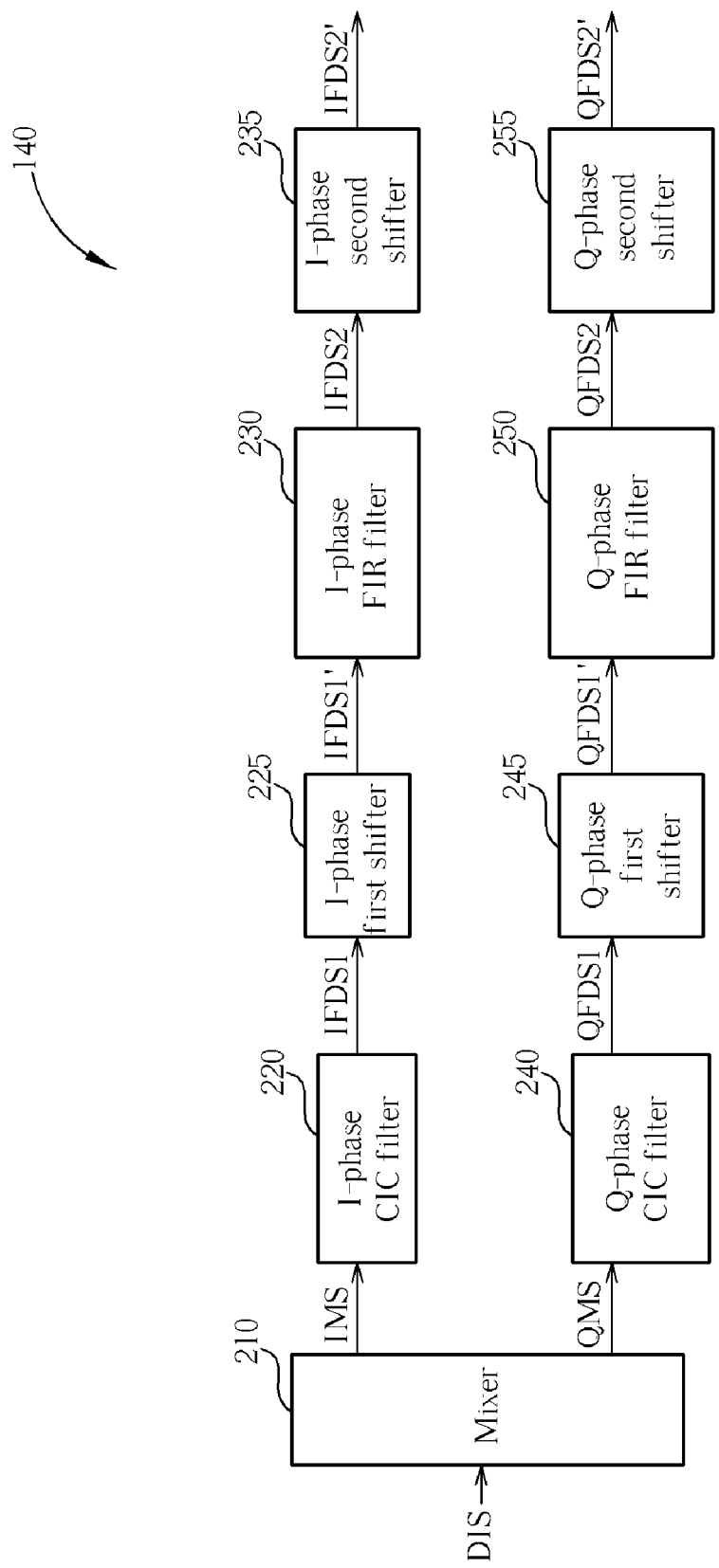
FIG. 2 shows an embodiment of the down-conversion device of FIG. 1.

FIG. 2 shows an embodiment of the down-conversion device 140. In FIG. 2, the down-conversion device 140 comprises a mixer 210, an In-phase Cascade Integrator Comb (CIC) filter 220, an In-phase first shifter 225, an In-phase Finite Impulse Response (FIR) filter 230, an In-phase second shifter 235, a Quadrature-phase CIC filter 240, a Quadrature-phase first shifter 245, a Quadrature-phase FIR filter 250, and a Quadrature-phase second shifter 255. The mixer 210 generates an In-phase mixed signal IMS and a Quadrature-phase mixed signal QMS according to the digital input signal DIS. The In-phase CIC filter 220, the In-phase first shifter 225, the In-phase FIR filter 230, and the In-phase second shifter 235 constitute an In-phase path that down-converts the frequency of the In-phase mixed signal IMS. Similarly, the Quadrature-phase CIC filter 240, the Quadrature-phase first shifter 245, the Quadrature-phase FIR filter 250, and the Quadrature-phase second shifter 255 constitute a Quadrature-phase path that down-converts the frequency of the Quadrature-phase mixed signal QMS. Since the signal processing of the Quadrature-phase path is quite similar to the In-phase path, the following paragraphs are focused on the In-phase path.

The In-phase CIC filter 220 is a first stage frequency divider of the In-phase path. The In-phase CIC filter 220 divides the In-phase mixed signal IMS by a first decimation ratio M1 to generate an In-phase first frequency-divided signal IFDS1. The In-phase first shifter 225 is an optional element. If the In-phase first shifter 225 is set in the output end of the In-phase CIC filter 220, the scale of the signal IFDS1 will be adaptively adjusted. For example, the In-phase first shifter 225 adaptively adjusts the scale of the signal IFDS1 to a full scale. The In-phase FIR filter 230 is a second stage frequency divider of the In-phase path and divides the In-phase first frequency-divided signal IFDS1', which is already scaled by the In-phase first shifter 225, by a second decimation ratio D to generate an In-phase second frequency-divided signal IFDS2. The In-phase second shifter 235 is an optional element. If the In-phase second shifter 235 is set on the output end of the In-phase FIR filter 230, the scale of the signal IFDS2 will be adaptively adjusted. For example, the In-phase second shifter 235 adaptively adjusts the scale of the signal IFDS2 to a full scale.

Figure 3:
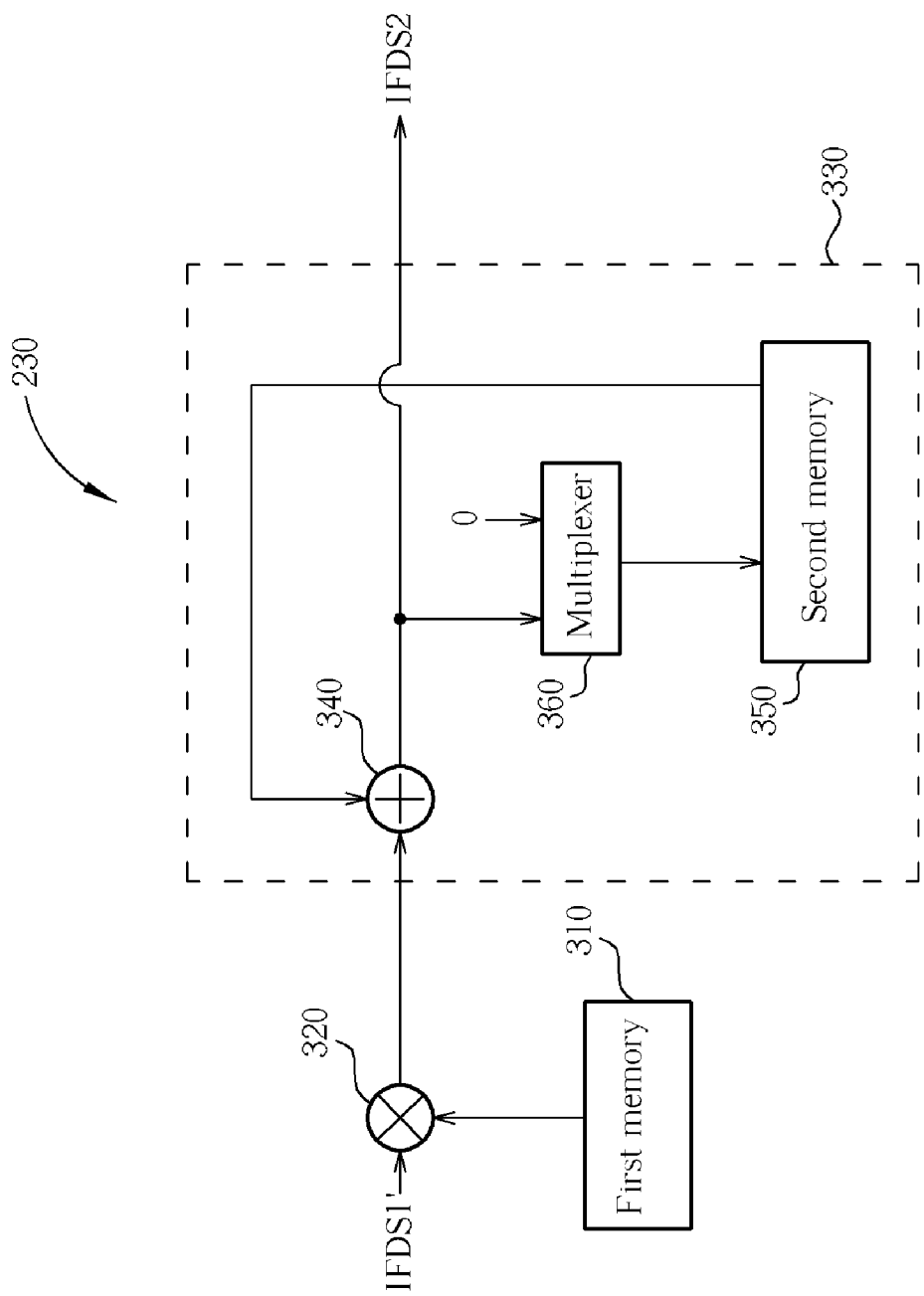
FIG. 3 shows an embodiment of the In-phase FIR filter of FIG. 2.

The In-phase FIR filter 230 of this embodiment is a programmable filter, which has a tap amount N and a second decimation ratio D, both of which are programmable. The signals IFDS1' and IFDS2 constitute the digital input signal and digital output signal of the In-phase FIR filter 230. If the sampling rate of the signal IFDS1' is SR1, the In-phase FIR filter 230 can be realized by a digital circuit having an operation frequency that is the same as or higher than N/D times of SR1. FIG. 3 shows an embodiment of the In-phase FIR filter 230. The In-phase FIR filter 230 comprises a first memory 310, a multiplier 320, and an accumulation module 330. The accumulation module 330 is made up of an adder 340, a second memory 350, and a multiplexer 360.

FIG. 4 is an exemplary diagram illustrating how the In-phase FIR filter 230 operates. In this example, the tap amount N and the second decimation ratio D equal 6 and 2, respectively. As mentioned, the operation frequency of the In-phase FIR filter 230 should be the same as or higher than 6/2=3 times of SR1. Since the second decimation ratio D equals 2, the sampling rate SR2 of the signal IFDS2 will be half the sampling rate SR1 of the signal IFDS1'. In this example, $x_0$, $x_1$, $x_2$, ..., $x_{12}$, $x_{13}$, $x_{14}$ are ordered input samples of the signal IFDS1'. The symbols $h_0$, $h_1$, $h_2$, $h_3$, $h_4$, and $h_5$ represent six tap coefficients, which are stored in the first memory 310, utilized by the In-phase FIR filter 230 when N equals 6. Symbols $y_0$, $y_1$, $y_2$, ..., $y_5$, $y_6$, and $y_7$ represent ordered output samples of the signal IFDS2. Aside from storing the six tap coefficients, the first memory 310 can also be used to store other tap coefficients, such as $h_6$, $h_7$, $h_8$.

In this embodiment, a sampling period $T_{1\_K}$ of the signal IFDS1' corresponds to three clock periods $T_{2\_3*K}$, $T_{2\_(3*K+1)}$, and $T_{2\_(3*K+2)}$ of the In-phase FIR filter 230, where K is an integer. For an input sample $x_K$ of the signal IFDS1' during the sampling period $T_{1\_K}$, the first memory 310 provides three corresponding tap coefficients $h_{[(-K) \bmod N]}$, $h_{[(-K+2) \bmod N]}$, and $h_{[(-K+4) \bmod N]}$ during three clock periods $T_{2\_3*K}$, $T_{2\_(3*K+1)}$, and $T_{2\_(3*K+2)}$ in turn. The multiplier 320 multiplies the input sample $x_K$ with the three tap coefficients $h_{[(-K) \bmod N]}$, $h_{[(-K+2) \bmod N]}$, and $h_{[(-K+4) \bmod N]}$ provided by the first memory 310 to generate three product values $p_{K\_1}$, $p_{K\_2}$, and $p_{K\_3}$ in turn. The adder 340 adds the three product values $p_{K\_1}$, $p_{K\_2}$, and $p_{K\_3}$ to three previous accumulation values $A_1$, $A_2$, and $A_3$ to generate three renewed accumulation values $A_1'$, $A_2'$, and $A_3'$. The second memory 350 stores the three previous accumulation values $A_1$, $A_2$, and $A_3$. For any renewed accumulation value $A_J'$, where J equals 1, 2, or 3, if $A_J'$ has already accumulated N=6 product values, the accumulation module 330 outputs $A_J'$ as an output sample of the signal IFDS2. Furthermore, the multiplexer 360 outputs a reset value 0 to the second memory 350 to reset the previous accumulation value $A_J$. On the other hand, if the renewed accumulation value $A_J'$ has not accumulated N=6 product values yet, the multiplexer 360 outputs a renewed accumulation value $A_J'$ to the second memory 350 to update the previous accumulation value $A_J$.

For example, the input sample $x_8$ corresponds to three clock periods $T_{2\_24}$, $T_{2\_25}$, and $T_{2\_26}$ of the In-phase FIR filter 230. During the clock period $T_{2\_24}$, the first memory 310 provides the tap coefficient $h_4$. The multiplier 320 generates the product value $p_{8\_1}$, which equals $x_8*h_4$. The previous accumulation value $A_1$ stored in the second memory 350 equals $(x_7*h_5)$. The adder 340 adds the product value $p_{8\_1}=x_8*h_4$ and the previous accumulation value $A_1$ to generate the renewed accumulation value $A_1'$. Since at this moment $A_1'$ has accumulated only two product values $(x_7*h_5)$ and $(x_8*h_4)$, the In-phase FIR filter 230 does not output $A_1'$ as an output sample of the signal IFDS2 at this moment. The multiplexer 360 then outputs the renewed accumulation value $A_1'$ to the second memory 350 to update the previous accumulation value $A_1$. During the clock period $T_{2\_25}$, the first memory 310 provides the tap coefficient $h_0$. The multiplier 320 generates the product value $p_{8\_2}$, which equals $x_8*h_0$. The previous accumulation value $A_2$ stored in the second memory 350 equals $(x_3*h_5)+(x_4*h_4)+(x_5*h_3)+(x_6*h_2)+(x_7*h_1)$. The adder 340 adds the product value $p_{8\_2}=x_8*h_0$ and the previous accumulation value $A_2$ to generate the renewed accumulation value $A_2'$. Since at this moment the renewed accumulation value $A_2'$ has already accumulated six product values, namely $(x_3*h_5)$, $(x_4*h_4)$, $(x_5*h_3)$, $(x_6*h_2)$, $(x_7*h_1)$, and $(x_8*h_0)$, the In-phase FIR filter 230 outputs $A_2'$ as an output sample $y_4$ of the signal IFDS2. The multiplexer 360 outputs the reset value 0 to the second memory 350 to reset the previous accumulation value $A_2$. During the clock period $T_{2\_26}$, the first memory 310 provides the tap coefficient $h_2$. The multiplier 320 generates the product value $p_{8\_3}$, which equals $x_8*h_2$. The previous accumulation value $A_3$ stored in the second memory 350 equals $(x_5*h_5)+(x_6*h_4)+(x_7*h_3)$. The adder 340 adds the product value $p_{8\_3}=x_8*h_2$ and the previous accumulation value $A_3$ to generate the renewed accumulation value $A_3'$. Since at this moment the renewed accumulation value has only accumulated four product values, namely $(x_5*h_5)$, $(x_6*h_4)$, $(x_7*h_3)$, and $(x_8*h_2)$, the In-phase FIR filter 230 does not output $A_3'$ as an output sample of the signal IFDS2 at this moment. The multiplexer 360 outputs the renewed accumulation value $A_3'$ to the second memory 350 to update the previous accumulation value $A_3$.

It deserves to be noted that after the adder 340 adds a product value of $h_0$ and an input sample $x_K$ received from the multiplier 320, then finishes the accumulation process, the renewed accumulation value that is generated by the adder 340 will have been accumulated six product values, namely $x_{K-5}*h_5$, $x_{K-4}*h_4$, $x_{K-3}*h_3$, $x_{K-2}*h_2$, $x_{K-1}*h_1$, and $x_K*h_0$. Therefore the In-phase FIR filter 230 can output the renewed accumulation value, which equals $\{(x_{K-5}*h_5)+(X_{K-4}*h_4)+(X_{K-3}*h_3)+(x_{K-2}*h_2)+(x_{K-1}*h_1)+(x_K*h_0)\}$ as an output sample of the signal IFDS2. Then the multiplexer 360 outputs the reset value 0 to the second memory 350 to reset the previous accumulation value, which equals $\{(x_{K-5}*h_5)+(x_{K-4}*h_4)+(x_{K-3}*h_3)+(x_{K-2}*h_2)+(x_{K-1}*h_1)\}$.

The aforementioned situation with N=6 and D=2 serves only as an example. In practice, N and D are two programmable parameters of the In-phase FIR filter 230. The DSP 170 is allowed to set the values of N and D according to a currently adopted TV audio standard.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An FIR filter for processing a digital input signal to generate a digital output signal, the FIR filter having a tap amount N and a decimation ratio D, the FIR filter comprising:
    a first memory for storing a plurality of tap coefficients, wherein for an input sample of the digital input signal, the first memory provides N/D corresponding tap coefficients from the plurality of tap coefficients in turn;
    a multiplier, coupled to the first memory, for multiplying the input sample with the N/D corresponding tap coefficients provided by the first memory in turn to generate N/D product values; and
    an accumulation module, coupled to the multiplier, for adding the N/D product values to N/D previous accumulation values in turn to generate N/D renewed accumulation values, wherein for a renewed accumulation value of the N/D renewed accumulation values, if the renewed accumulation value has already accumulated N product values, the accumulation module outputs the renewed accumulation value as an output sample of the digital output signal.

2. The FIR filter of claim 1, wherein the accumulation module comprises:
    an adder, coupled to the multiplier, for adding the N/D product values to the N/D previous accumulation values in turn to generate the N/D renewed accumulation values;
    a second memory, coupled to the adder, for storing the N/D previous accumulation values; and
    a multiplexer, coupled to the adder and the second memory, wherein for a renewed accumulation value of the N/D renewed accumulation values, if the renewed accumulation value has already accumulated N product values, the multiplexer outputs a reset value to the second memory to reset a corresponding previous accumulation value of the N/D previous accumulation values, and if the renewed accumulation value has not accumulated N product values yet, the multiplexer outputs the renewed accumulation value to the second memory to update the corresponding previous accumulation value.

3. The FIR filter of claim 1, wherein the operation frequency of the FIR filter is the same as or higher than N/D times the sampling rate of the digital input signal.

4. A down-conversion device, for down-converting a digital input signal to generate a digital output signal, the down-conversion device comprising:
    a mixer, for generating a mixed signal according to the digital input signal;
    a CIC filter, coupled to the mixer, for dividing the mixed signal by a first decimation ratio to generate a first frequency-divided signal; and
    an FIR filter, coupled to the CIC filter, for dividing the first frequency-divided signal by a second decimation ratio D to generate the digital output signal;
    wherein the FIR filter has a tap amount N and the second decimation ratio D, and the FIR filter comprises:
    a first memory for storing a plurality of tap coefficients, wherein for an input sample of the first frequency-divided signal, the first memory provides N/D corresponding tap coefficients from the plurality of tap coefficients in turn;
    a multiplier, coupled to the first memory, for multiplying the input sample with the N/D corresponding tap coefficients provided by the first memory in turn to generate N/D product values; and
    an accumulation module, coupled to the multiplier, for adding the N/D product values to N/D previous accumulation values in turn to generate N/D renewed accumulation values, wherein for a renewed accumulation value of the N/D renewed accumulation values, if the renewed accumulation value has already accumulated N product values, the accumulation module outputs the renewed accumulation value as an output sample of the digital output signal.

5. The down-conversion device of claim 4, wherein the digital input signal is generated through processing a sound IF signal.

6. The down-conversion device of claim 4 further comprising a first shifter, coupled between the CIC filter and the FIR filter, for adjusting the scale of the first frequency-divided signal.

7. The down-conversion device of claim 4 further comprising a second shifter, coupled to an output end of the FIR filter, for adjusting the scale of the digital output signal.

8. The down-conversion device of claim 4, wherein the accumulation module comprises:
    an adder, coupled to the multiplier, for adding the N/D product values to the N/D previous accumulation values in turn to generate the N/D renewed accumulation values;
    a second memory, coupled to the adder, for storing the N/D previous accumulation values; and
    a multiplexer, coupled to the adder and the second memory, wherein for a renewed accumulation value of the N/D renewed accumulation values, if the renewed accumulation value has already accumulated N product values, the multiplexer outputs a reset value to the second memory to reset a corresponding previous accumulation value of the N/D previous accumulation values, and if the renewed accumulation value has not accumulated N product values yet, the multiplexer outputs the renewed accumulation value to the second memory to update the corresponding previous accumulation value.

9. The down-conversion device of claim 4, wherein the operation frequency of the FIR filter is the same as or higher than N/D times the sampling rate of the first frequency-divided signal.

10. A sound signal processing system, for processing a sound IF signal, the sound signal processing system comprising:
  a gain amplifier, for amplifying the sound IF signal according to a gain so as to generate an amplified signal;
  an LPF, coupled to the gain amplifier, for low-pass-filtering the amplified signal to generate a filtered signal;
  an ADC, coupled to the LPF, for converting the filtered signal into a digital input signal;
  a down-conversion device, coupled to the ADC, the down-conversion device comprising:
    a mixer, coupled to the ADC, for generating a mixed signal according to the digital input signal;
    a CIC filter, coupled to the mixer, for dividing the mixed signal by a first decimation ratio to generate a first frequency-divided signal; and
    an FIR filter, coupled to the CIC filter, for dividing the first frequency-divided signal by a second decimation ratio D to generate the digital output signal; and
  a DSP, coupled to the down-conversion device, for processing the digital output signal.

11. The sound signal processing system of claim 10, wherein the down-conversion device further comprises a first shifter, coupled between the CIC filter and the FIR filter, for adjusting the scale of the first frequency-divided signal.

12. The sound signal processing system of claim 10, wherein the down-conversion device further comprises a second shifter, coupled to an output end of the FIR filter, for adjusting the scale of the digital output signal.

13. The sound signal processing system of claim 10, wherein the FIR filter has a tap amount N and the second decimation ratio D, and the FIR filter comprises:
  a first memory for storing a plurality of tap coefficients, wherein for an input sample of the first frequency-divided signal, the first memory provides N/D corresponding tap coefficients from the plurality of tap coefficients in turn;
  a multiplier, coupled to the first memory, for multiplying the input sample with the N/D corresponding tap coefficients provided by the first memory in turn to generate N/D product values; and
  an accumulation module, coupled to the multiplier, for adding the N/D product values to N/D previous accumulation values in turn to generate N/D renewed accumulation values, wherein for a renewed accumulation value of the N/D renewed accumulation values, if the renewed accumulation value has already accumulated N product values, the accumulation module outputs the renewed accumulation value as an output sample of the digital output signal.

14. The sound signal processing system of claim 13, wherein the accumulation module comprises:
  an adder, coupled to the multiplier, for adding the N/D product values to the N/D previous accumulation values in turn to generate the N/D renewed accumulation values;
  a second memory, coupled to the adder, for storing the N/D previous accumulation values; and
  a multiplexer, coupled to the adder and the second memory, wherein for a renewed accumulation value of the N/D renewed accumulation values, if the renewed accumulation value has already accumulated N product values, the multiplexer outputs a reset value to the second memory to reset a corresponding previous accumulation value of the N/D previous accumulation values, and if the renewed accumulation value has not accumulated N product values yet, the multiplexer outputs the renewed accumulation value to the second memory to update the corresponding previous accumulation value.

15. The sound signal processing system of claim 13, wherein the operation frequency of the FIR filter is the same as or higher than N/D times the sampling rate of the first frequency-divided signal.

16. The sound signal processing system of claim 13 further comprising a register bank, coupled to the DSP and the FIR filter, the DSP utilizing the register bank to control the tap amount N and the second decimation ratio D of the FIR filter.

17. A method of performing a FIR-filtering operation on a digital input signal for an FIR-filter to generate a digital output signal, the FIR-filtering operation having a tap amount N and a decimation ratio D, the method comprising:
  for an input sample of the digital input signal, providing N/D corresponding tap coefficients from a plurality of tap coefficients in turn;
  multiplying the input sample with the N/D corresponding tap coefficients in turn to generate N/D product values by a multiplier;
  adding the N/D product values to N/D previous accumulation values in turn to generate N/D renewed accumulation values by an accumulation module; and
  if a renewed accumulation value of the N/D renewed accumulation values has already accumulated N product values, outputting the renewed accumulation value as an output sample of the digital output signal.

18. The method of claim 17, further comprising:
  if the renewed accumulation value has not accumulated N product values yet, outputting the renewed accumulation value to update a corresponding previous accumulation value of the N/D previous accumulation values.

19. The method of claim 17, further comprising:
  if the renewed accumulation value has already accumulated N product values, outputting a reset value to reset a corresponding previous accumulation value of the N/D previous accumulation values.

* * * * *